(12) United States Patent
Choi

(10) Patent No.: US 8,891,274 B2
(45) Date of Patent: Nov. 18, 2014

(54) SEMICONDUCTOR DEVICE

(71) Applicant: SK Hynix Inc., Icheon-si (KR)

(72) Inventor: Eun Seok Choi, Seongnam-si (KR)

(73) Assignee: SK Hynix Inc., Gyeonggi-do (KR)

( * ) Notice: Subject to any disclaimer, the term of this patent is extended or adjusted under 35 U.S.C. 154(b) by 67 days.

(21) Appl. No.: 13/716,498

(22) Filed: Dec. 17, 2012

(65) Prior Publication Data

US 2014/0056071 A1 Feb. 27, 2014

(30) Foreign Application Priority Data

Aug. 24, 2012 (KR) .................. 10-2012-0093155

(51) Int. Cl.
*G11C 5/02* (2006.01)
*G11C 16/04* (2006.01)
*G11C 5/06* (2006.01)

(52) U.S. Cl.
CPC .............. *G11C 16/0408* (2013.01); *G11C 5/02* (2013.01); *G11C 5/06* (2013.01); *G11C 5/025* (2013.01)
USPC ...... 365/51; 365/63; 365/185.11; 365/185.17

(58) Field of Classification Search
CPC ............. G11C 5/02; G11C 5/025; G11C 5/06
USPC ............................. 365/51, 63, 185.11, 185.17
See application file for complete search history.

(56) References Cited

U.S. PATENT DOCUMENTS

| 5,195,054 | A | * | 3/1993 | Noda ............................... 365/63 |
| 5,250,831 | A | * | 10/1993 | Ishii ............................... 257/354 |
| 6,144,584 | A | * | 11/2000 | Kunori et al. ............ 365/185.18 |
| 6,157,569 | A | * | 12/2000 | Nomura et al. .......... 365/185.11 |
| 6,239,500 | B1 | * | 5/2001 | Sugimachi .................... 257/203 |
| 6,297,129 | B2 | * | 10/2001 | Tran et al. ..................... 438/439 |
| 6,362,506 | B1 | * | 3/2002 | Miyai ........................... 257/330 |
| 6,417,549 | B1 | * | 7/2002 | Oh ................................. 257/401 |
| 6,867,994 | B2 | * | 3/2005 | Tsukikawa ..................... 365/72 |
| 6,953,959 | B2 | * | 10/2005 | Yang et al. .................... 257/296 |
| 6,967,365 | B2 | * | 11/2005 | Summerfelt et al. ......... 257/295 |
| 7,006,370 | B1 | * | 2/2006 | Ramesh et al. ................. 365/63 |
| 7,054,219 | B1 | * | 5/2006 | Petti et al. ................ 365/230.06 |
| 7,126,835 | B2 | * | 10/2006 | Takahashi et al. .............. 365/63 |
| 7,292,465 | B2 | * | 11/2007 | Koide ........................... 365/145 |
| 7,349,234 | B2 | * | 3/2008 | Peng et al. ..................... 365/66 |
| 7,393,739 | B2 | * | 7/2008 | Gopalakrishnan et al. ... 438/202 |
| 8,238,714 | B2 | * | 8/2012 | Hashimoto et al. ........... 386/240 |

FOREIGN PATENT DOCUMENTS

KR 101073074 B1 10/2011

* cited by examiner

*Primary Examiner* — Viet Q Nguyen
(74) *Attorney, Agent, or Firm* — William Park & Associates Patent Ltd.

(57) ABSTRACT

A semiconductor device includes a first memory block configured to include first active areas extended parallel in a first direction, a second memory block adjacent to the first memory block and configured to include second active areas extended parallel in the first direction, the second active areas being staggered from the first active areas, first bit lines disposed on the first active areas, and second bit lines disposed on the second active areas.

20 Claims, 11 Drawing Sheets

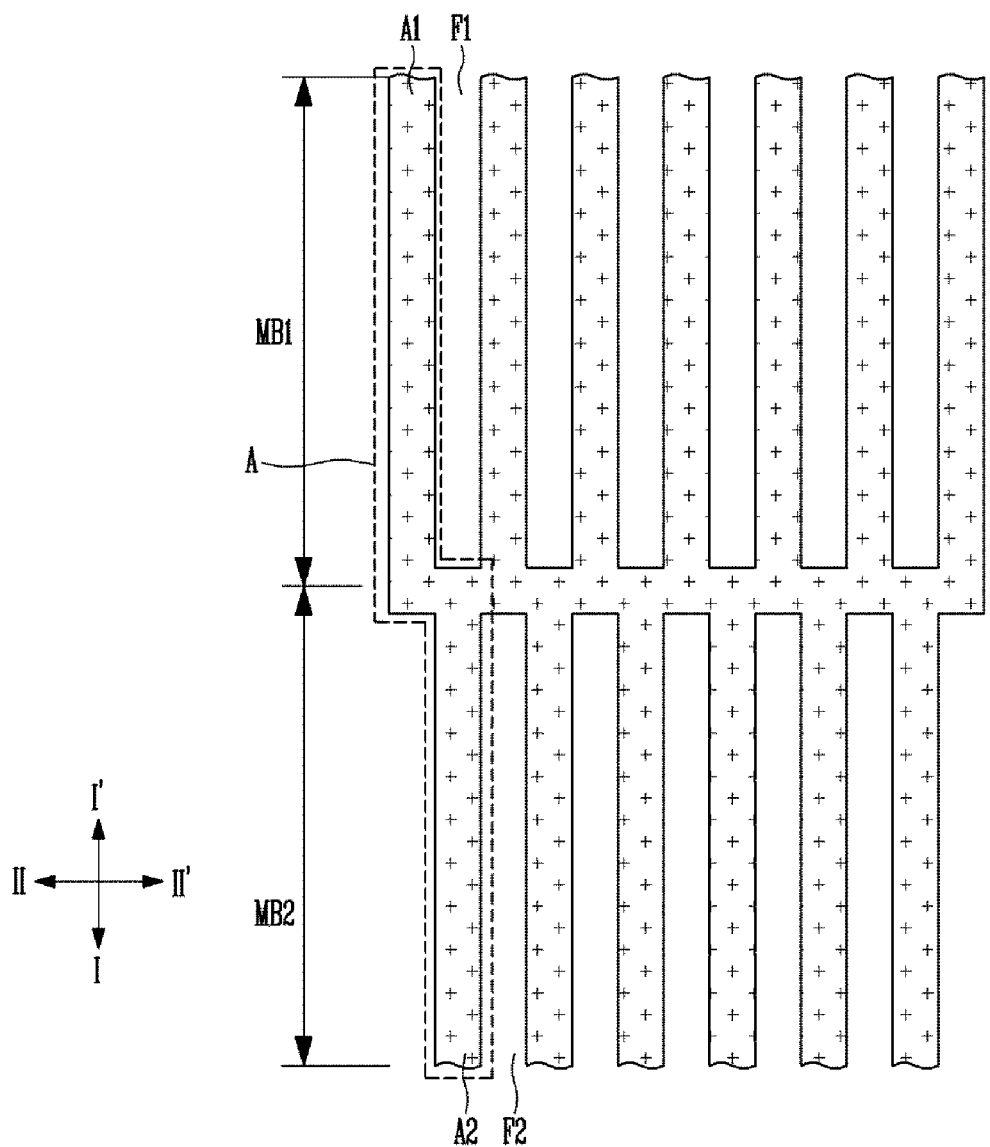

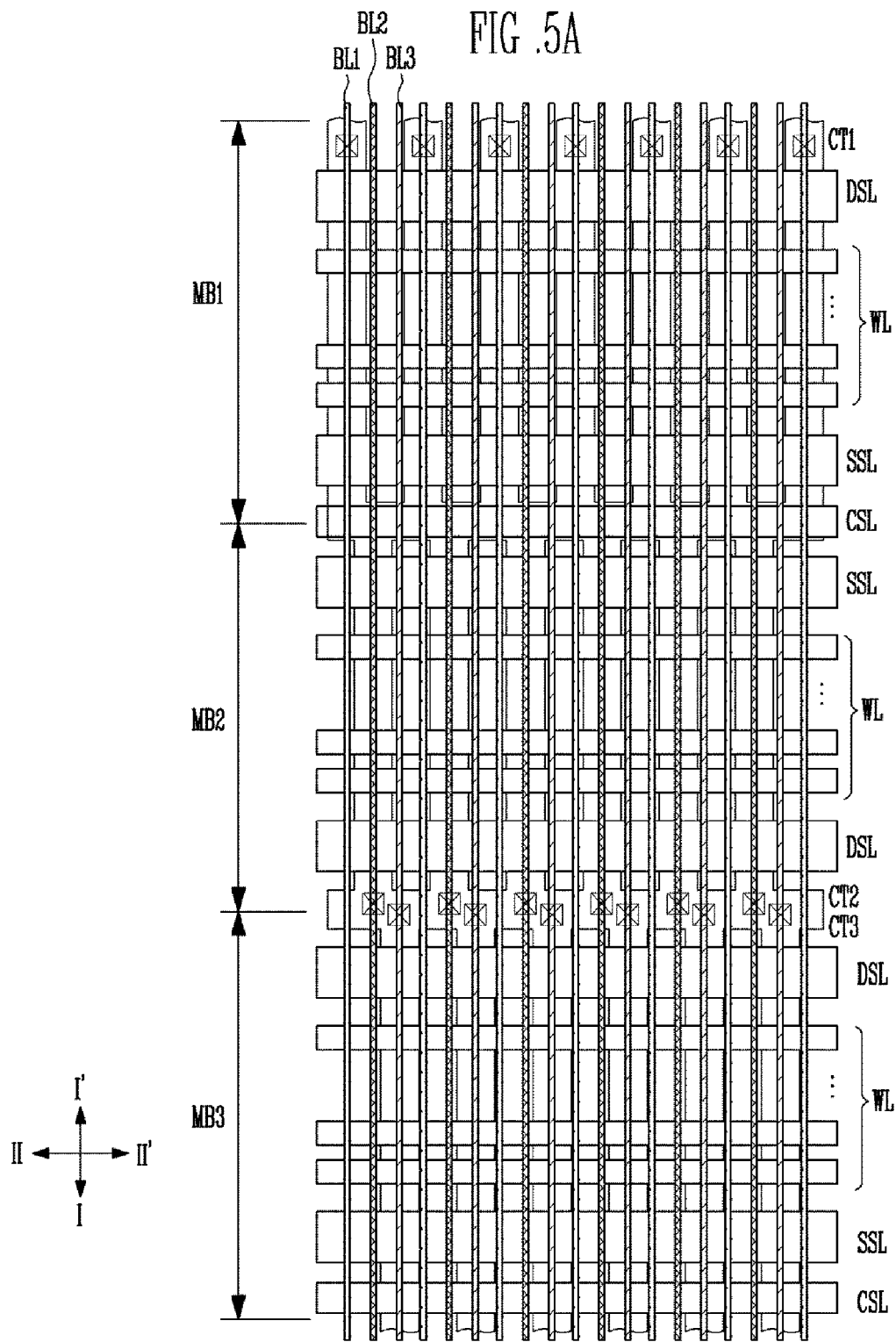

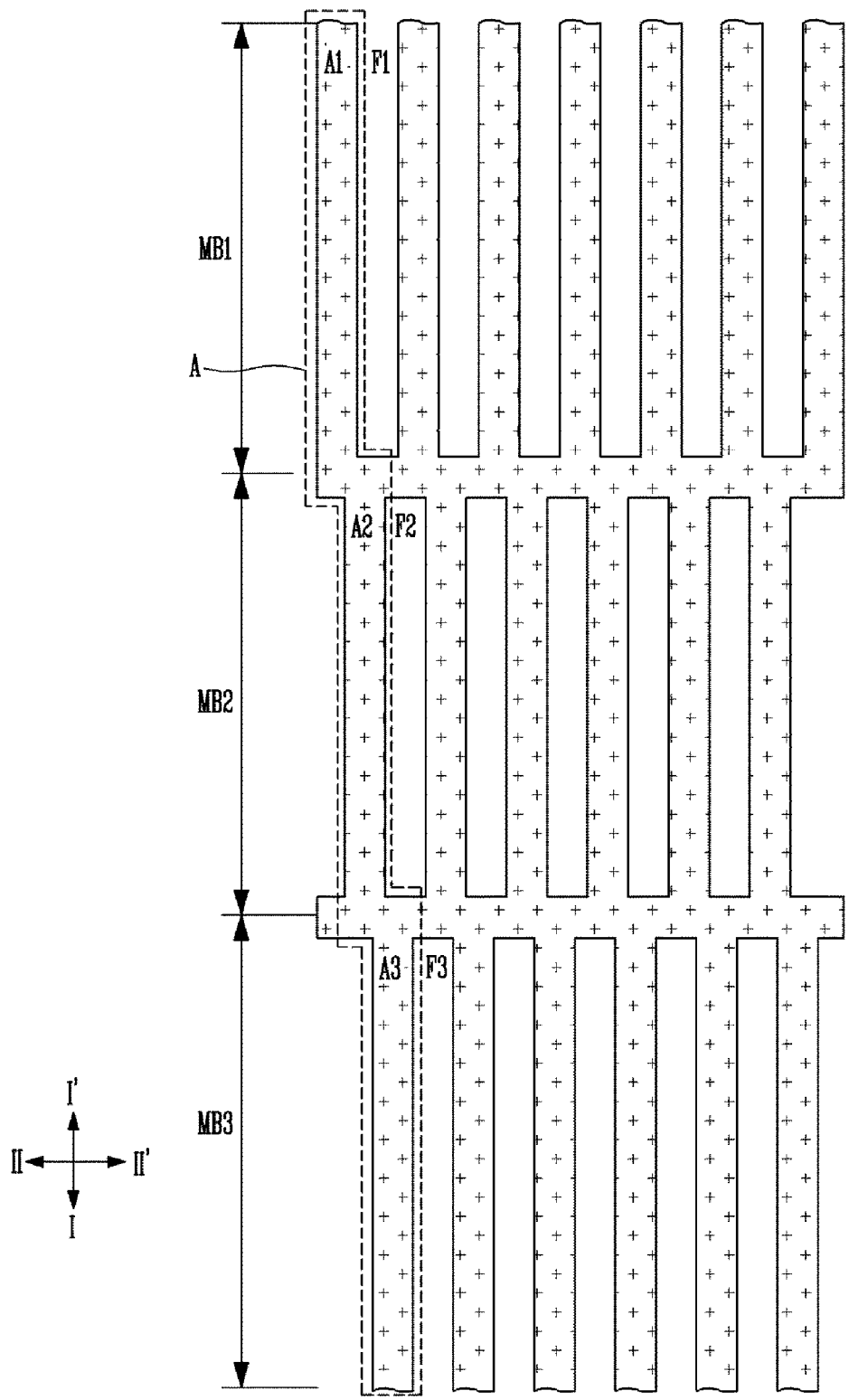

SEMICONDUCTOR DEVICE

CROSS-REFERENCE TO RELATED APPLICATION

This application claims priority from Korean Patent Application No. 10-2012-0093155, filed on Aug. 24, 2012, the contents of which are incorporated herein by reference in its entirety.

BACKGROUND

1. Technical Field

The present invention generally relates to a semiconductor device, more particularly relates to a non-volatile memory device.

2. Related Art

A non-volatile memory device means a memory device in which stored data is remained though a power is not supplied, and is divided into an electric charge trap-type memory device and a floating gate-type device. Here, the electric charge trap-type memory device stores data by trapping or discharging electric charges to a deep level trap site in a electric charge trap layer, and the floating gate-type memory device stores data by storing or discharging electric charges to a conductive band of a floating gate.

Hereinafter, structure of the conventional non-volatile memory device will be described in detail with reference to drawings.

FIG. 1a to FIG. 1c illustrate a layout and a section view of the conventional non-volatile memory device. FIG. 1a shows a layout of a cell array, FIG. 1B illustrates a layout of each of areas of a substrate, and FIG. 1c shows a cross section of a memory cell.

As shown in FIG. 1a to FIG. 1c, the conventional non-volatile memory device includes memory blocks MB1 and MB2 and a common source line CSL located between neighbored memory blocks MB1 and MB2. Here, each of the memory blocks MB1 and MB2 includes a drain select line DSL, word lines WL and a source select line SSL extended parallel in a second direction II-II'.

A memory device includes an isolation layer 17 formed in a field area F of a substrate 10, and thus an active area A extended parallel in a first direction I-I' is defined. The memory device includes a tunnel insulating layer 11, a floating gate 12, an electric charge blocking layer 13 and a control gate 14 (i.e., 14(WL)), an interlayer dielectric layer 15 and bit lines 16 (i.e., 16(BL)) stacked in sequence on the substrate 10

The active area A corresponds one-to-one to the bit line BL, and the bit lines BL are coupled to the active areas A through a bit line contact plug CT1 and CT2, respectively.

Accordingly, both of width of the active area A and width of the bit line BL should be reduced, so as to enhance integrity of the memory device. However, a gap-fill process has its limit to reduce the width of the active area A in a process of forming the isolation layer 17 by which the active area A is defined.

SUMMARY OF THE INVENTION

Embodiments provide a semiconductor device for enhancing integrity of a memory device.

A semiconductor device according to an embodiment includes a first memory block configured to include first active areas extended parallel in a first direction; a second memory block adjacent to the first memory block, and configured to include second active areas extended parallel in the first direction, the second active areas being staggered from the first active areas; first bit lines disposed on the first active areas; and second bit lines disposed on the second active areas.

A semiconductor device according to an embodiment includes a first memory block configured to include first channel structures extended in parallel in a first direction, the first channel structures including stacked first channel layers; a second memory block adjacent to the first memory block, and configured to include second channel structures extended in parallel in the first direction, the second channel structures including stacked second channel layers and being disposed staggered from the first channel structures; first bit lines disposed on the first channel structures; and second bit lines disposed on the second channel structures.

Memory blocks of a semiconductor device include active areas or channel structures staggered each another. Neighbored memory blocks may be driven in the same manner or driven independently. If the neighbored memory blocks are driven in the same manner, area of bit lines of each of memory cell may reduce, and length of a word line may reduce by half or more. Accordingly, resistance of the word line and capacitance between neighbored bit lines may reduce.

BRIEF DESCRIPTION OF THE DRAWINGS

The above and other features and advantages of the embodiments will become readily apparent by reference to the following detailed description when considered in conjunction with the accompanying drawings wherein:

FIG. 2a to FIG. 2c are views illustrating layout and section of a semiconductor device according to a first embodiment;

FIG. 5a to FIG. 5c are views illustrating layout and cross section of a semiconductor device according to a second embodiment;

DETAILED DESCRIPTION

Hereinafter, the embodiments will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1A:
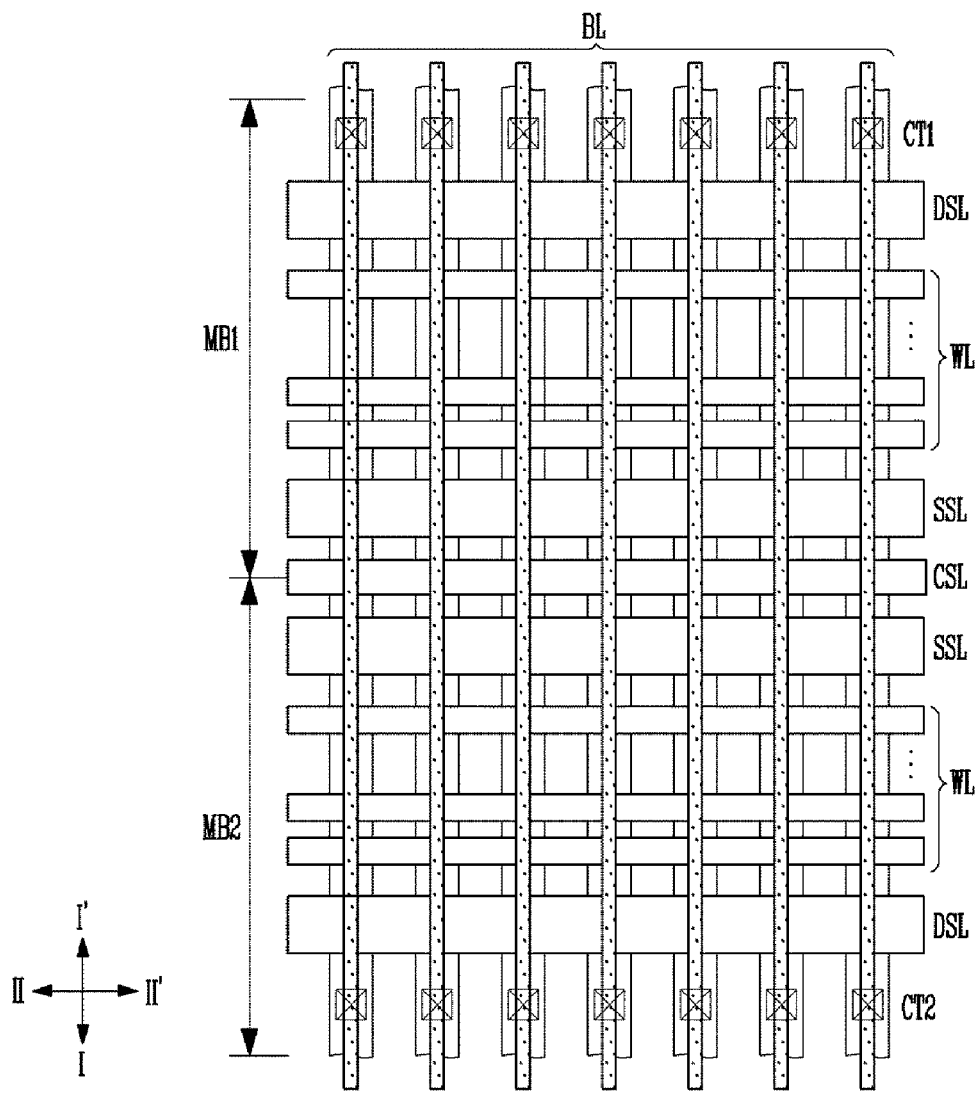
FIG. 1a to FIG. 1c are views illustrating layout and section of the conventional non-volatile memory device.
Figure 1B:
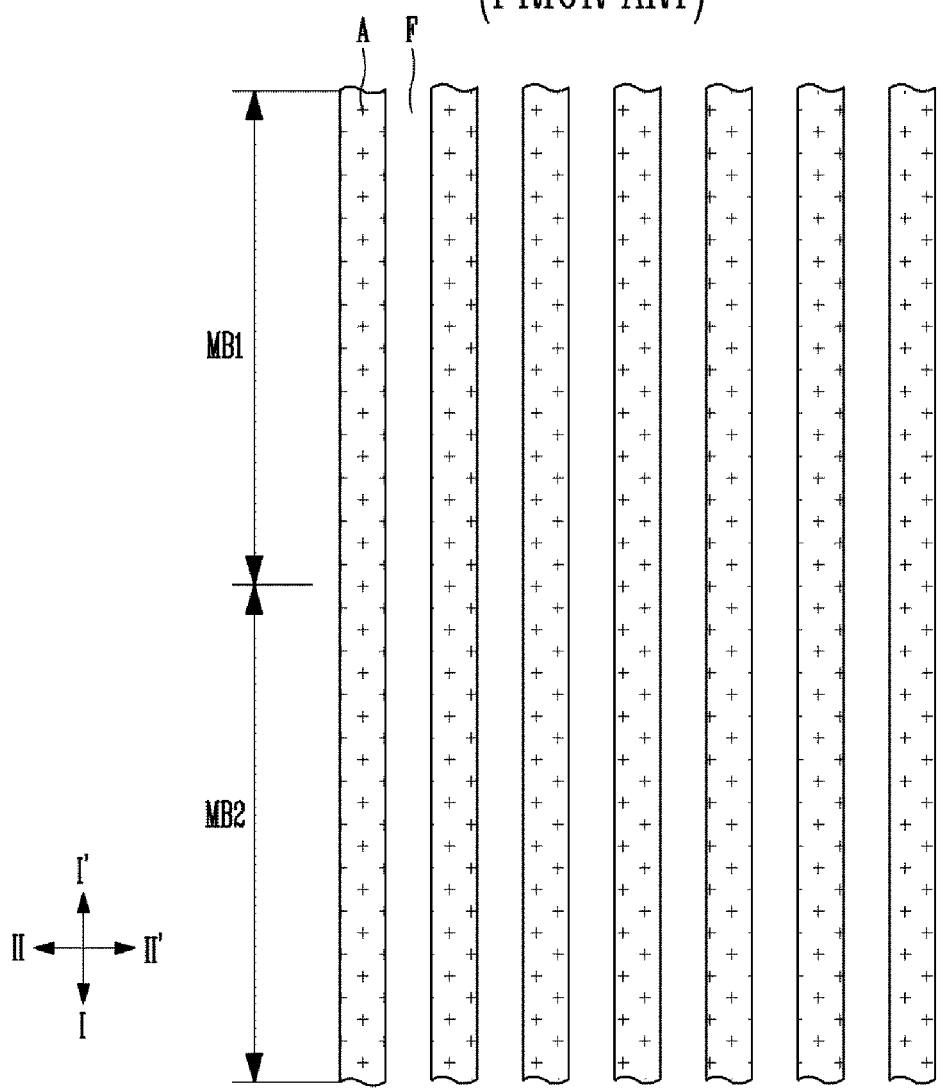
Figure 1C:
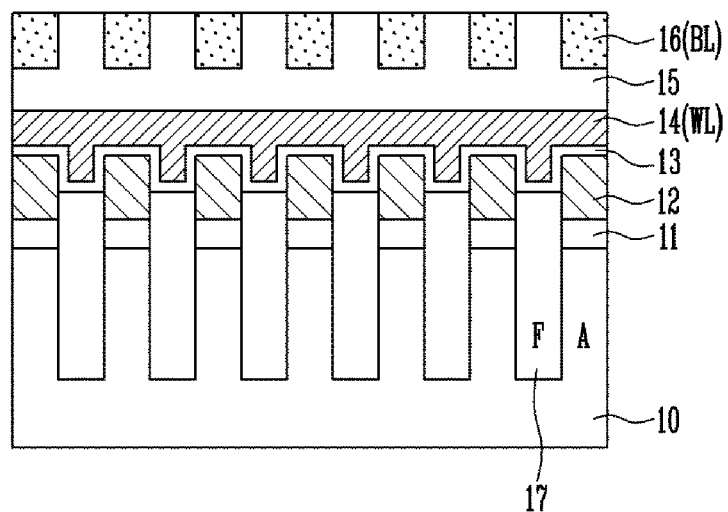
Figure 2A:
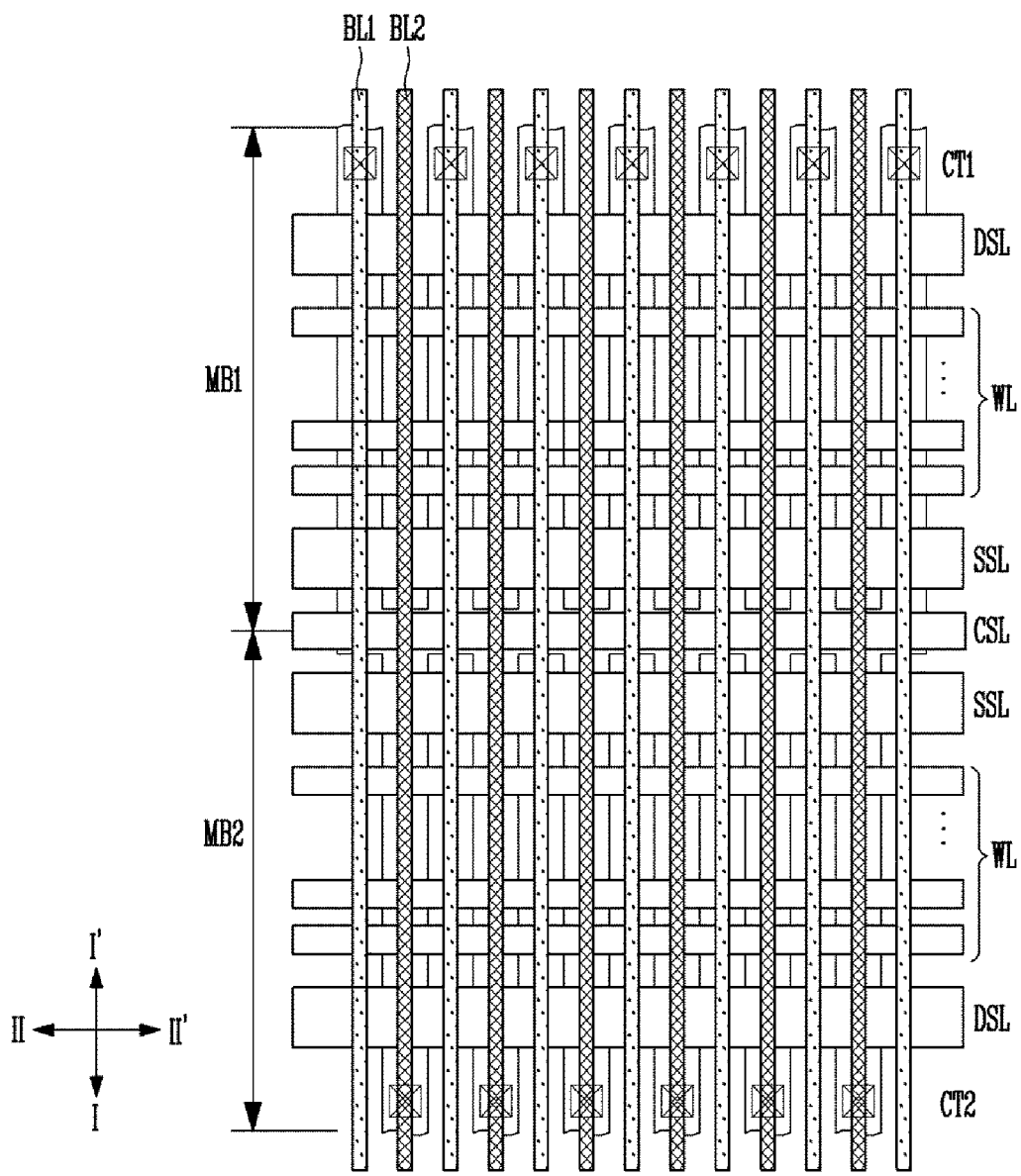
Figure 2C:
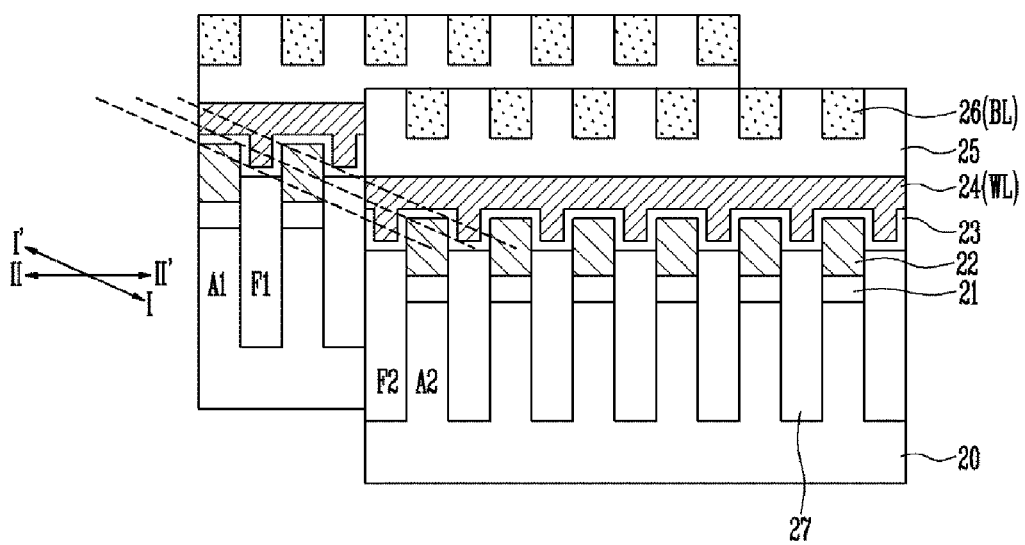

FIG. 2a to FIG. 2c are views illustrating a layout and a cross section of a semiconductor device according to a first embodiment. FIG. 2a shows a layout of a cell array, FIG. 2b illustrates a layout of each of areas of a substrate, and FIG. 2c shows a cross section of a memory cell.

As shown in FIG. 2a to FIG. 2c, a semiconductor device may include memory blocks MB1 and MB2 and a common source line CSL located between neighbored memory blocks MB1 and MB2. Accordingly, neighbored memory blocks MB1 and MB2 share one common source line CSL.

Here, each of the memory blocks MB1 and MB2 may include word lines WL extended parallel in a second direction II-II', one or more drain select lines DSL and at least one source select line SSL disposed at both sides of the word lines WL.

The semiconductor device may include an isolation layer 27 formed in a field area F (i.e., F1 or F2) of a substrate 20, and thus active areas A1 and A2 are defined. Here, neighbored memory blocks MB1 and MB2 include the active areas A1 and A2 staggered to each other. For example, one active area A is extended parallel in a first direction I-I', and is bent at an area of the common source line CSL. In this case, a first active area A1 of the first memory block MB1 and a second active area A2 of the second memory block MB2 are staggered in disposition.

The semiconductor device may further include a tunnel insulating layer 21, a floating gate 22, an electric charge blocking layer 23 and a control gate 24 (i.e., 24(WL)) stacked in sequence on the substrate 20. The control gates 24 of memory cells disposed in a second direction II-II' are coupled by the word line WL.

The semiconductor device may further include an interlayer dielectric layer 25 and bit lines 26 (i.e., 26(BL)) formed on the control gate 24. Here, one active area A corresponds one-to-N to a bit line BL1 or BL2, N being positive integer more than 2. In a first embodiment, the first bit line BL1 is formed on the first active area A1, and the second bit line BL2 is formed on the second active area A2. Accordingly, one active area A corresponds one-to-two to the bit line BL1 or BL2.

The semiconductor device further may include a first contact plug CT1 and a second contact plug CT2, the first contact plug CT1 coupling the first bit line BL1 to the first active area A1 and the second contact plug CT2 coupling the second bit line BL2 to the second active area A2. Here, the first contact plug CT1 and the second contact plug CT2 are disposed staggered to each other.

As described above, since one active area A is coupled to two bit lines BL1 and BL2, pitch of the bit lines of each of memory cells may reduce. Accordingly, length of the word line may reduce by half or more of the length of the word line in the conventional technique. Additionally, resistance of the word line and capacitance between the bit lines may reduce.

Figure 3:
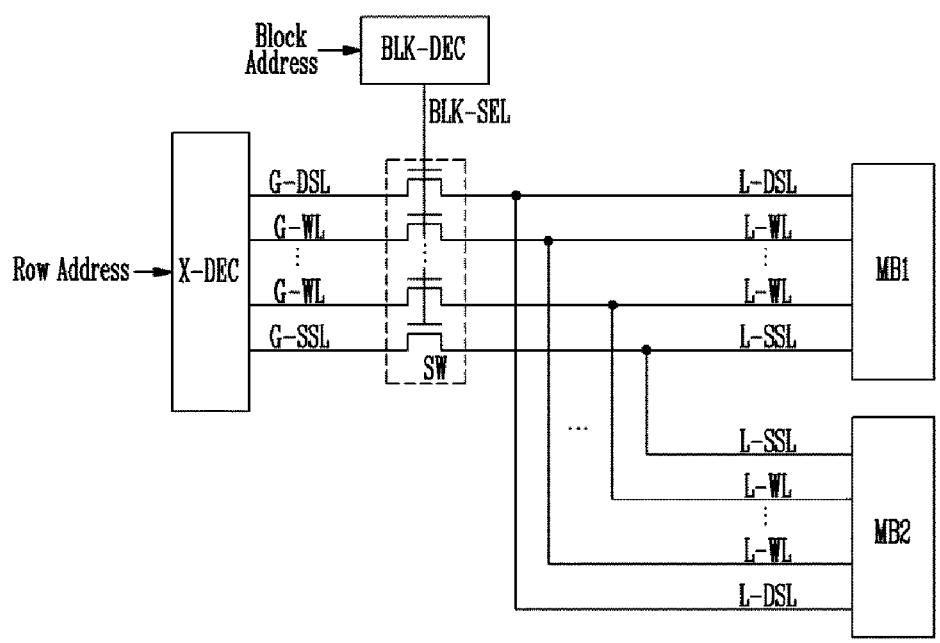
FIG. 3 is a view illustrating circuit diagram of a semiconductor device according to a first embodiment.

FIG. 3 is a view illustrating circuit diagram of a semiconductor device according to a first embodiment. FIG. 3 shows the circuit for driving a first memory block and a second memory block in the same manner.

In FIG. 3, the semiconductor device of an embodiment may include a first memory block MB1, a second memory block MB2, an X-decoder X-DEC, a block decoder BLK-DEC and a switch SW.

A row address is inputted to the X-decoder X-DEC and the X-decoder X-DEC generates voltages supplied to at least one global drain select line G_DSL, global word lines G_WL and one or more global source select line G_SSL, respectively.

A block address is inputted to the block decoder BLK_DEC to select desired memory block group. For example, the semiconductor device may include memory blocks, and two memory blocks are included in one memory block group. In the event that a program operation, a read operation or an erase operation is performed in a unit of the memory block group, the block address may include information concerning a memory block group to be selected.

The block decoder BLK-DEC enables a block select signal BLK_SEL in response to the inputted block address, thereby turning on the switch SW. As a result, voltages supplied to the global lines G_DSL, G_WL and G_SSL are delivered to local lines L-DSL, L-WL, and L-SSL coupled to corresponding memory block MB1 or MB2.

In the event that the decoder is used as described above, the first and the second memory blocks MB1 and MB2, including the active areas A1 and A2 disposed staggered each other, may be driven in a same manner. Accordingly, the semiconductor device may reduce area of the bit line in each of the memory cells and reduce length of the word line by half or more. Additionally, the semiconductor device may reduce resistance of the word line and capacitance between neighbored bit lines.

Figure 4:
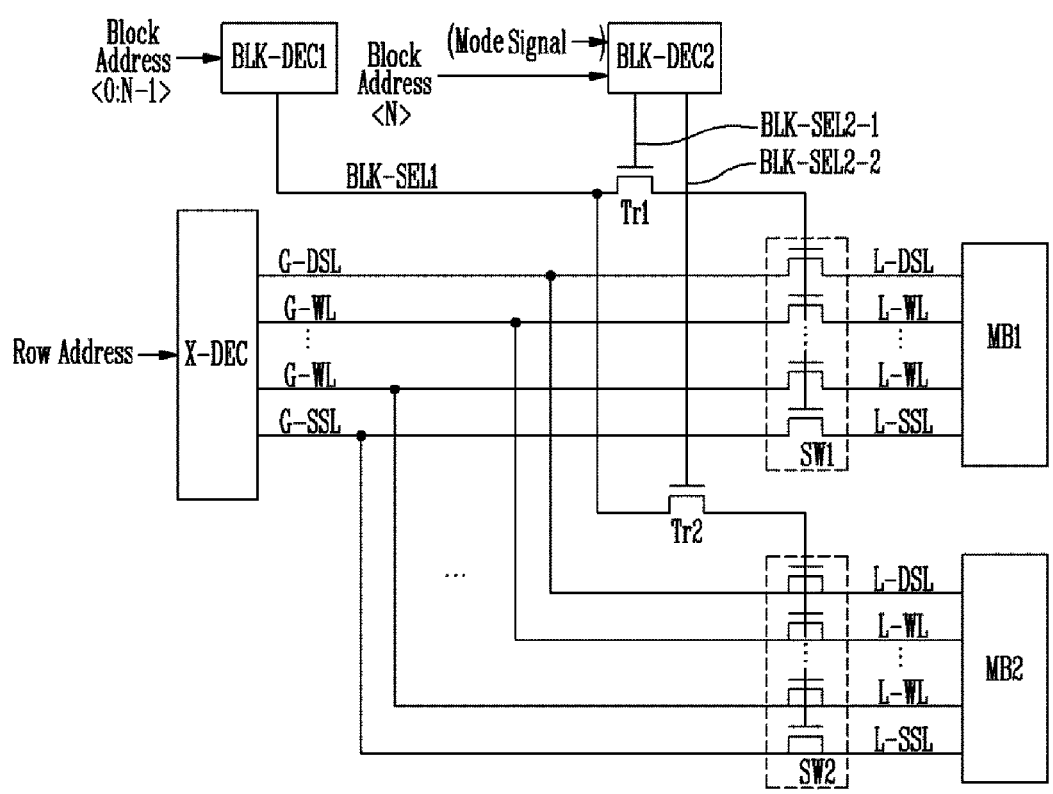
FIG. 4 is a view illustrating circuit diagram of a semiconductor device according to a first embodiment.

FIG. 4 is a view illustrating circuit diagram of a semiconductor device according to a first embodiment. FIG. 4 shows the circuit for driving independently a first memory block and a second memory block.

In FIG. 4, the semiconductor device may include a first memory block MB1, a second memory block MB2, an X-decoder X-DEC, block decoders BLK-DEC1 and BLK-DEC2 and switches SW1 and SW2.

A row address is inputted to the X-decoder X-DEC and the X-decoder X-DEC generates voltages supplied to at least one global drain select line G_DSL, global word lines G_WL and one or more global source select line G_SSL, respectively.

A block address is inputted to the first block decoder BLK-DEC1 and the second block decoder BLK-DEC2. For example, in the event that the block address corresponds to N bit, a block address <1:N−1>, including information concerning memory block group to be selected, is inputted to the first block decoder BLK-DEC1.

A block address N, including information concerning a memory block to be driven of memory blocks included in the selected memory block group, is inputted to the second block decoder BLK-DEC2. The second block decoder BLK-DEC2 activates or inactivates second block signals BLK_SEL2-1 and BLK_SEL2-2 in response to the inputted information. For example, in the event that the second block select signal BLK_SEL2-1 is activated, the first switch SW1 is turned on, and so signals of the global lines G_DSL, G_WL and G_SSL are delivered to the local lines L-DSL, L-WL, and L-SSL coupled to the first memory block MB1. Here, the second block select signal BLK_SEL2-2 is inactivated, and thus the second switch SW2 is turned off.

In the event that the decoders are used as described above, the semiconductor device may drive independently the first memory block MB1 and the second memory block MB2. Accordingly, interference between neighbored memory cells may be removed in a program operation or a read operation.

In an embodiment, it is possible to select a driving mode by using the decoder in FIG. 4, the driving mode being a mode for determining whether the memory blocks MB1 and MB2 in one memory block group are driven in the same manner or driven independently. Particularly, a mode signal is further inputted to the second block decoder BLK-DEC2. For example, in the event that the mode signal has "1", the semiconductor device activates both of the second block select signals BLK_SEL2-1 and BLK_SEL2-2. In this case, transistors Tr1 and Tr2 are turned on and the first and the second memory blocks MB1 and MB2 are driven in the same manner. In the event that the mode signal has "0", the semiconductor device activates or inactivates the second block select signal BLK_SEL2-1 or BLK_SEL2-2 in response to the block address inputted to the second block decoder BLK-DEC2. In this case, transistor Tr1 or Tr2 is turned on and the first and the second memory blocks MB1 and MB2 are driven independently. Additionally, a first block select signal BLK_SEL1, local drain select lines L-DSL, local word lines L-WL, and local source select lines L-SSL are illustrated.

Figure 5C:
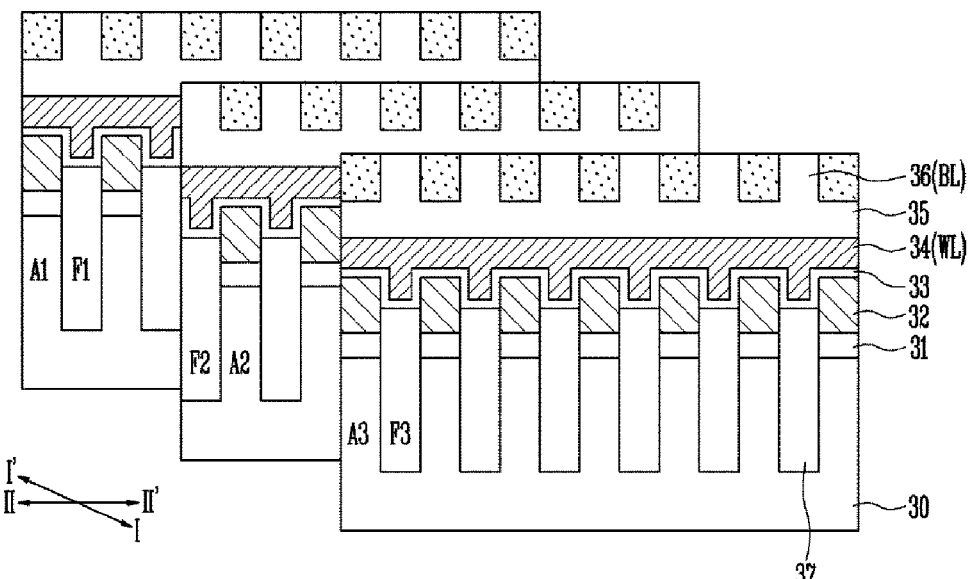

FIG. 5a to FIG. 5c are views illustrating a layout and a cross section of a semiconductor device according to a second embodiment. FIG. 5a shows a layout of a cell array, FIG. 5b illustrates a layout of each of areas of a substrate, and FIG. 5c shows a cross section of a memory cell. Hereinafter, any further description concerning the same elements as in the first embodiment will be omitted.

In FIG. 5a to FIG. 5b, the semiconductor device may include memory blocks MB1 to MB3. Here, each of the memory blocks MB1 to MB3 may include word lines WL extended parallel in a second direction II-II' and at least one drain select line DSL and one or more source select line SSL located at both sides of the word lines WL.

Active areas A1 to A3 are defined by an isolation layer 37 formed in a field area F (i.e., F1 to F3) of a substrate 30. Here, width of the active area A1 to A3 is substantially identical to that of the isolation layer 37 or is different from that of the isolation layer 37. In FIG. 5c, the width of the isolation layer 37 is substantially identical to the active area A1 to A3, the active areas A1 to A3 of neighbored memory blocks MB1 to MB3 are disposed staggered to one another, and the active areas A1 to A3 are overlapped.

Neighbored memory blocks MB1 to MB3 may include the active areas A1 to A3 staggered from one another. For example, one active area A is extended parallel in a first direction I-I', and it is bent at a common source line CSL and a contact area CT (i.e., CT1 to CT3).

The semiconductor device may further include a tunnel insulating layer 31, a floating gate 32, an electric charge blocking layer 33, a control gate 34 (i.e., 34(WL)), an interlayer dielectric layer 35 and bit lines 36 (i.e., 36(BL)) stacked in sequence on the substrate 30.

In the second embodiment, a first bit line BL1 is formed on the first active area A1, a second bit line BL2 is formed on the second active area A2, and a third bit line BL3 is formed on the third active area A3. Accordingly, one active area A corresponds one-to-three to the bit line BL1 to BL3.

The semiconductor device may further include a first contact plug CT1 for coupling the first bit line BL1 to the first active area A1, a second contact plug CT2 for coupling the second bit line BL2 to the second active area A2, and a third contact plug CT3 for coupling the third bit line BL3 to the third active area A3. Here, the first to the third contact plugs CT1 to CT3 are disposed staggered each other.

Figure 6:
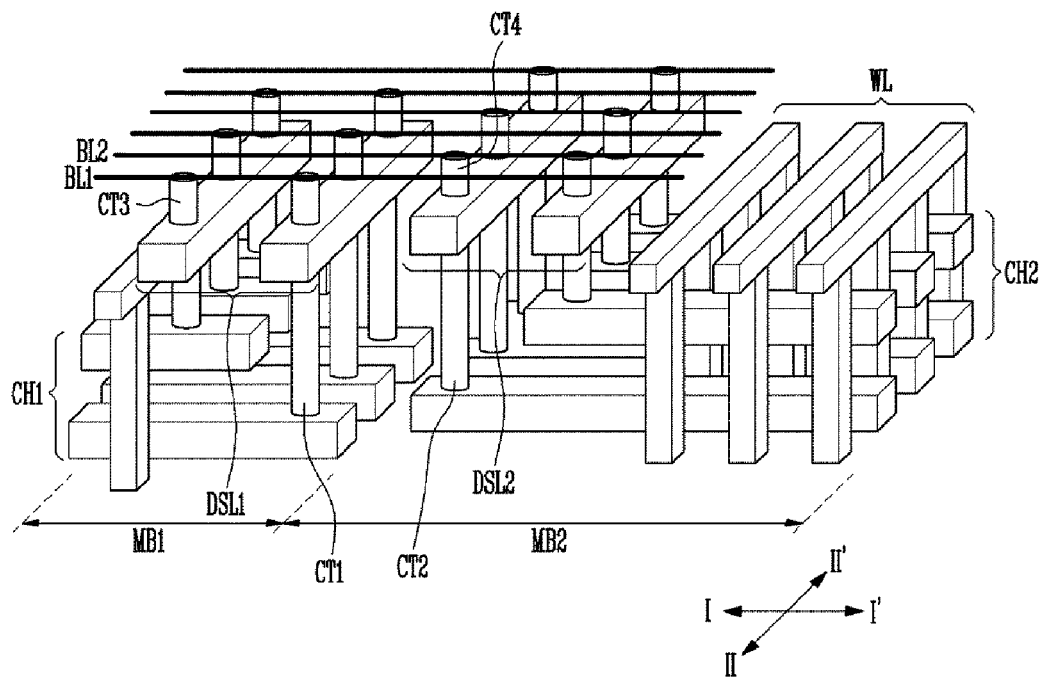
FIG. 6 is a perspective view illustrating structure of a semiconductor device according to a third embodiment.

FIG. 6 is a perspective view illustrating structure of a semiconductor device according to a third embodiment. FIG. 6 omits an interlayer dielectric layer for convenience of description, and shows the structure based on a channel layer and conductive lines.

In FIG. 6, the semiconductor device may include memory blocks MB1 and MB2, and each of the memory blocks MB1 and MB2 may have channel structures extended in parallel in a first direction I-I'. Channel layers included in each of the channel structures in the present embodiment correspond to the active areas in the first embodiment. Accordingly, location of the channel structures corresponds to that of the active areas in the first embodiment.

First channel structures in the first memory block MB1 include first interlayer dielectric layers (not shown) and first channel layers CH1 stacked in turn. The first channel layers CH1 stacked with multi layers are patterned in step with extended in the first direction I-I'.

Second channel structures in the second memory block MB2 include second interlayer dielectric layers (not shown) and second channel layers CH2 stacked in turn. The second channel layers CH2 stacked with multi layers are patterned in step with extended in the first direction I-I'. The second channel structures are staggered from the first channel structures.

The semiconductor device may further include word lines WL extended parallel in a second direction II-II', they crossing the first and the second channel structures. For example, gate pillars locate respectively between corresponding channel structures, and the word lines WL couple the gate pillars disposed in the second direction II-II'. A memory layer (not shown) is formed between the gate pillars and the channel structures. For example, the memory layer may include a tunnel insulating layer, an electric charge storage layer and an electric charge blocking layer. Here, the electric charge storage layer may include one of an electric charge storage layer for storing electric charges with made up of poly silicon, etc., a trap layer for trapping electric charges with made up of nitride layer, etc., and nanodot, or include their combination. The memory layer may include a phase change material layer instead of the electric charge storage layer.

The semiconductor device may further include first contact plugs CT1 coupled to each of the first channel layers CH1 and first drain select lines DSL1 extended parallel in a second direction II-II' with surrounding upper parts of the first contact plugs CT1.

First select transistors are formed in a cross area of the first contact plugs CT1 and the first drain select lines DSL1. The first drain select transistor uses the first contact plug CT1 as a channel layer, and further may include a gate insulating layer disposed between the first contact plug CT1 and the first drain select line DSL1. In this case, the first drain select transistor may have a gate all around structure GAA where front side of the channel layer is surrounded by a gate electrode.

The semiconductor device may further include second contact plugs CT2 coupled to each of the second channel layers CH2 and second drain select lines DSL2 extended parallel in the second direction II-II' with surrounding upper parts of the second contact plugs CT2.

Second select transistors are formed in a cross area of the second contact plugs CT2 and the second drain select lines DSL2. The second drain select transistor may have a gate all around structure GAA like first drain select transistor.

The semiconductor device may further include third contact plugs CT3 coupled to the upper parts of the first contact plugs CT1 and fourth contact plugs CT4 coupled to the upper parts of the second contact plugs CT2.

The semiconductor device may further include first bit lines BL1 located on the first channel structures and second bit lines BL2 disposed on the second channel structures. Here, the first bit lines BL1 are respectively coupled to the third contact plugs CT3 which are electrically connected to one first channel structure, and the second bit lines BL2 are respectively coupled to the fourth contact plugs CT4 which are electrically connected to one second channel structure.

The semiconductor device of the present embodiment forms the memory cell to have multi layers stacked on the substrate, thereby enhancing integrity of the memory device. In addition, the semiconductor device forms the channel structures of neighbored memory blocks to disposed staggered each other, thereby reducing pitch of the bit lines of each of the memory cells. Accordingly, length of the word line may reduce by half or more of length of the word line in the conventional technique, and may reduce resistance of the word line and capacitance between the bit lines.

The semiconductor device of the present embodiment may drive the first memory block MB1 and the second memory block MB2 in the same manner or drive the first memory block MB1 and the second memory block MB2 independently according to the decoder, like the first embodiment.

The semiconductor device of the present embodiment may include the channel structures where three memory blocks are disposed staggered one another, like the second embodiment. For example, the semiconductor device may further include a third channel structure adjacent to the second memory block MB2 and a third bit line BL3 formed on the third channel structure, the third channel structure being staggered from the first and the second channel structures. The third channel structure may include third channel layers CH3 with multi layers, and is extended parallel in the first direction I-I'. The semiconductor device may drive the first to the third memory blocks in the same manner or drive the first to the third memory blocks independently according to the decoder.

Figure 7:
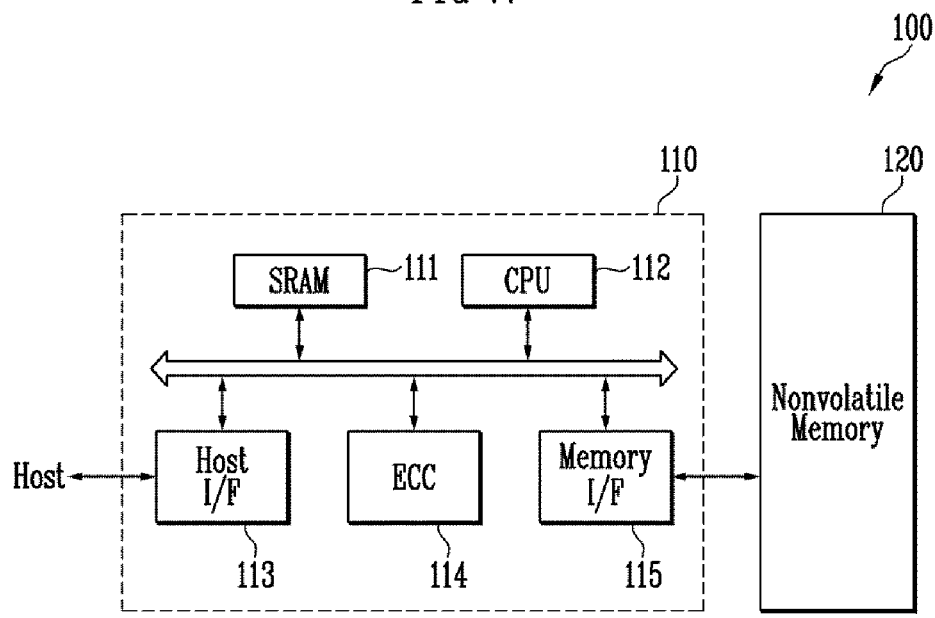
FIG. 7 is a block diagram illustrating a memory system according to an embodiment.

FIG. 7 is a block diagram illustrating a memory system according to an embodiment.

In FIG. 7, the memory system 100 of the present embodiment may include a non-volatile memory device 120 and a memory controller 110.

The non-volatile memory device 120 may have a structure in accordance with layout as shown in above. The non-volatile memory device 120 may be a multi-chip package including flash memory chips.

The memory controller 110 controls the non-volatile memory device 120, and may include an SRAM 111, a CPU 112, a host interface 113, an ECC 114 and a memory interface 115. The SRAM 111 is used as an operation memory of the CPU 112, the CPU 112 controls operation of exchanging data with the memory controller 110, and the host interface 113 has data exchange protocol of a host accessed to the memory system 100. The ECC 114 detects and corrects error of data read from the non-volatile memory device 120, and the memory interface 115 interfaces with the non-volatile memory device 120. The memory controller 110 may further include a ROM for storing code data for interfacing with the hose and so on.

The memory system 100 may be a memory card where the non-volatile memory device 120 and the controller 110 are combined, or a solid state disk SSD. For example, in the event that the memory system 100 is the SSD, the memory controller 110 may communicate with an outside device, e.g. host through one of various interface protocols such as USB, MMC, PCI-E, SATA, PATA, SCSI, ESDI, IDE, etc.

Figure 8:
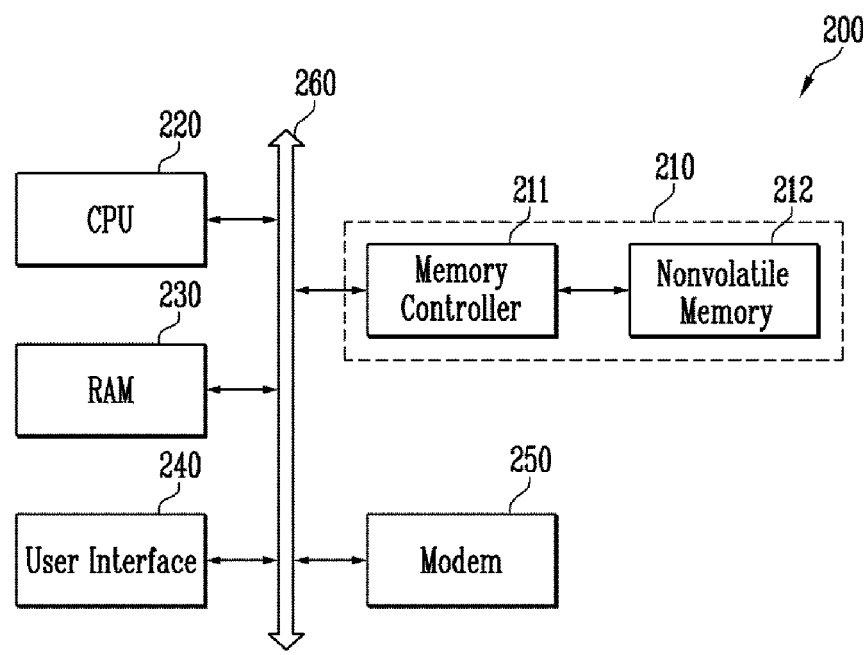
FIG. 8 is a view illustrating a computing system according to an embodiment.

FIG. 8 is a view illustrating a computing system according to an embodiment.

In FIG. 8, the computing system 200 of the present embodiment may include a CUP 220 connected electrically to a system bus 260, an RAM 230, a user interface 240, a modem 250 and a memory system 210. In the event that the computer system 200 is a mobile device, a battery (not shown) for supplying an operation voltage of the computing system 200 may be further provided. The computing system 200 may further include an application chipset, a camera image processor CIS, a mobile DRAM, etc.

The memory system 210 may include the non-volatile memory device 212 and the memory controller 211 as shown in FIG. 7.

Various embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A semiconductor device comprising:
   a first memory block configured to include first active areas extended parallel in a first direction;
   a second memory block adjacent to the first memory block in the first direction, and configured to include second active areas extended parallel in the first direction, the second active areas being staggered from the first active areas;
   first bit lines disposed on the first active areas; and
   second bit lines disposed on the second active areas.

2. The semiconductor device of claim 1, further comprising:
   first contact plugs configured to couple the first active areas with the first bit lines, respectively; and
   second contact plugs configured to couple the second active areas with the second bit lines, respectively.

3. The semiconductor device of claim 2, wherein the first contact plugs and the second contact plugs are disposed staggered to each other.

4. The semiconductor device of claim 1, further comprising:
   a common source line located between the first memory block and the second memory block, and extended in a second direction crossing the first direction.

5. The semiconductor device of claim 1, wherein the first memory block and the second memory block are operated in a same manner when a program operation, a read operation or an erase operation is performed.

6. The semiconductor device of claim 1, wherein the first memory block and the second memory block are independently driven when a program operation, a read operation or an erase operation is performed.

7. The semiconductor device of claim 1, further comprising:
   a third memory block adjacent to the second memory block in the first direction, and configured to include third active areas extended parallel in the first direction, the third active areas being disposed staggered from the first and the second active areas; and
   third bit lines disposed on the third active areas.

8. The semiconductor device of claim 7, further comprising:
   first contact plugs configured to couple the first active areas with the first bit lines, respectively;
   second contact plugs configured to couple the second active areas with the second bit lines, respectively; and
   third contact plugs configured to couple the third active areas with the third bit lines, respectively.

9. A semiconductor device comprising:
   a first memory block configured to include first channel structures extended in parallel in a first direction, wherein each of the first channel structures includes first channel layers and first dielectric layers alternately stacked;
   a second memory block adjacent to the first memory block in the first direction, and configured to include second channel structures extended in parallel in the first direction, wherein each of the second channel structures includes second channel layers and second dielectric layers alternately stacked and being disposed staggered from the first channel structures;
   first bit lines disposed on the first channel structures; and
   second bit lines disposed on the second channel structures.

10. The semiconductor device of claim 9, further comprising:
    first contact plugs coupled to the first channel layers, respectively;
    first drain select lines extended parallel in a second direction crossing the first direction and configured to surround upper parts of the first contact plugs;

second contact plugs coupled to the second channel layers, respectively; and second drain select lines extended parallel in the second direction and configured to surround upper parts of the second contact plugs.

11. The semiconductor device of claim 10, further comprising:

third contact plugs coupled to the upper parts of the first contact plugs; and fourth contact plugs coupled to the upper parts of the second contact plugs, wherein the first bit lines are respectively coupled to the third contact plugs, and the second bit lines are respectively coupled to the fourth contact plugs.

12. The semiconductor device of claim 9, wherein the first memory block and the second memory block are operated in a same manner when a program operation, a read operation or an erase operation is performed.

13. The semiconductor device of claim 9, wherein the first memory block and the second memory block are independently driven when a program operation, a read operation or an erase operation is performed.

14. The semiconductor device of claim 9, further comprising:

a third memory block adjacent to the second memory block, and configured to include third channel structures extended parallel in the first direction, wherein the third channel structures include third channel layers stacked with multi layers and the third channel structures being disposed staggered from the first and the second channel structures; and third bit lines disposed on the third channel structures.

15. The semiconductor device of claim 9, further comprising:

word lines extended in parallel in the second direction crossing the first and the second channel structures.

16. The semiconductor device of claim 1, wherein each of the first and second active areas has a straight line shape.

17. The semiconductor device of claim 1, further comprising:

first memory cells formed on the first active areas and arranged in the first direction; and second memory cells formed on the second active areas and arranged in the first direction.

18. The semiconductor device of claim 17, wherein the first memory cells are staggered from the second memory cells.

19. The semiconductor device of claim 1, further comprising:

first word lines extended in parallel in the second direction crossing the first active areas;

one or more first drain select lines extended in parallel in the second direction crossing the first active areas;

one or more first source select lines extended in parallel in the second direction crossing the first active areas, wherein the one or more first drain select lines and the one or more first source select lines are disposed at both sides of the first word lines.

20. The semiconductor device of claim 1, further comprising:

second word lines extended in parallel in the second direction crossing the second active areas;

one or more second drain select lines extended in parallel in the second direction crossing the second active areas;

one or more second source select lines extended in parallel in the second direction crossing the second active areas, wherein the one or more second drain select lines and the one or more second source select lines are disposed at both sides of the second word lines.

* * * * *